US009252809B2

(12) United States Patent
Hirth

(10) Patent No.: US 9,252,809 B2
(45) Date of Patent: Feb. 2, 2016

(54) USING FEC STATISTICS TO TUNE SERDES

(71) Applicant: Broadcom Corporation, Irvine, CA (US)

(72) Inventor: Ryan Hirth, Windsor, CA (US)

(73) Assignee: Broadcom Corporation, Irvine, CA (US)

( * ) Notice: Subject to any disclaimer, the term of this patent is extended or adjusted under 35 U.S.C. 154(b) by 191 days.

(21) Appl. No.: 13/649,544

(22) Filed: Oct. 11, 2012

(65) Prior Publication Data

US 2014/0108879 A1   Apr. 17, 2014

(51) Int. Cl.
*H03H 7/00* (2006.01)
*G06F 11/00* (2006.01)
*H03M 13/00* (2006.01)
*H03M 13/01* (2006.01)
*H04L 1/16* (2006.01)
*H03M 13/05* (2006.01)

(52) U.S. Cl.
CPC ............... *H03M 13/015* (2013.01); *H04L 1/16* (2013.01); *H03M 13/05* (2013.01)

(58) Field of Classification Search
None
See application file for complete search history.

(56) References Cited

U.S. PATENT DOCUMENTS

| | | | | |
|---|---|---|---|---|
| 7,149,938 | B1 * | 12/2006 | Acikel et al. | 714/709 |
| 7,551,815 | B2 * | 6/2009 | Welch et al. | 385/24 |
| 7,715,323 | B2 * | 5/2010 | Connolly et al. | 370/252 |
| 8,208,591 | B2 * | 6/2012 | Flynn | H04L 25/03019 375/229 |
| 8,548,038 | B2 * | 10/2013 | Sindalovsky et al. | 375/232 |
| 8,578,222 | B2 * | 11/2013 | Chun et al. | 714/708 |
| 9,059,911 | B2 * | 6/2015 | Anantharam | H04L 43/0817 |
| 2009/0187807 | A1 * | 7/2009 | Narasimha et al. | 714/761 |
| 2009/0257514 | A1 * | 10/2009 | Connolly et al. | 375/257 |
| 2010/0329325 | A1 * | 12/2010 | Mobin et al. | 375/232 |
| 2012/0216084 | A1 * | 8/2012 | Chun et al. | 714/708 |

* cited by examiner

*Primary Examiner* — Justin R Knapp
(74) *Attorney, Agent, or Firm* — Fiala & Weaver P.L.L.C.

(57) ABSTRACT

Serializer-Deserializer (SerDes) operation is optimized for signals based on signal error statistics. Forward Error Correction (FEC) may provide feedback of error statistics or error correction statistics to a SerDes tuner, which uses the statistics to selectively tune or adjust SerDes operating parameters, such as vertical and horizontal sampling or slicing offsets, gain and equalization, to decrease the bit error rate (BER). Statistics report which bits and patterns are corrected and to what values. Knowledge of expected and actual signals is leveraged to correlate detected errors with underlying problems and solutions to optimize SerDes operation. Each node in a network, such as a Ethernet Passive Optical Network (EPON), is enabled to fine tune its operation independently for each logical or physical channel.

20 Claims, 3 Drawing Sheets

USING FEC STATISTICS TO TUNE SERDES

BACKGROUND

A passive optical network (PON) is a point-to-multipoint network fiber architecture for providing broadband services to business and residential subscribers. A PON comprises an optical transmission line (e.g., a fiber or optical link) coupled to an upstream node, such as an optical line terminal (OLT) located at service provider premises or central office (CO), and coupled to a downstream node, such as an optical network units (ONU), located at service subscriber or end-user premises.

A PON may implement a variety of topologies, such as tree, ring, or bus topologies. In a tree topology, one optical fiber couples the OLT to a passive optical splitter, which distributes downstream optical signals from an OLT to ONUs and combines upstream optical signals from ONUs to the OLT. The splitter merges or multiplexes upstream communications onto the shared optical link. A splitter may use a time division multiple access (TDMA) protocol where packet communications from ONUs are assigned time slots for transmission to the OLT. Alternatively, a splitter may use a distinct frequency for each ONU, such as in wavelength division multiplexing (WDM). An OLT may couple an optical access network to an external network, such as a metro backbone belonging to an internet service provider (ISP) or a local exchange carrier.

Communication in a PON comprises upstream traffic transmitted from ONUs to an OLT and downstream traffic transmitted from the OLT to the ONUs. ONUs share channel capacity and resources provided by the shared optical link coupling the passive optical splitter and the OLT. The passive optical splitter may divide (separate) and distribute downstream communications (optical signals) from the OLT to each ONU or may broadcast downstream communications transmitted by the OLT to all ONUs where each destination ONU extracts data frames from communications based on Logic Link Identifiers (LLIDs) assigned to each ONU. An LLID establishes a logical link between an ONU and OLT, which accommodates specific service level agreement (SLA) requirements. An LLID carries physical address information for a frame to determine which ONU is allowed to extract the frame.

An Ethernet passive optical network (EPON) combines Ethernet technology with inexpensive passive optics. An EPON offers the simplicity and scalability of Ethernet with the cost-efficiency and high capacity of passive optics. In particular, due to the high bandwidth of optical fibers, EPONs are capable of accommodating broadband voice, data, and video traffic simultaneously.

Each ONU can accommodate a number of networked devices, such as personal computers, telephones, video equipment, network servers, etc. One or more networked devices belonging to the same class of service are typically assigned an LLID.

Because a PON adopts passive optical transmission technology, which excludes signal amplification and regeneration, a PON is subject to power limitations and various transmission impairments. As a result, the signal-to-noise ratio of a PON suffers as the network increases in size, resulting in more frequent bit errors. Fortunately, forward error correction (FEC) techniques can mitigate these undesirable effects and can help increase the power budget.

FEC is a transmission error correction technique allowing a receiving device to detect and correct errors. A receiving device, such as each ONU and each OLT in a PON, utilizing FEC has the capability to detect and correct any block of symbols that contains fewer than a predetermined number of error symbols. A transmitting device supports FEC by adding bits to each transmitted symbol block, using a predetermined error correction technique. One exemplary technique is the use of Reed-Solomon code. A Reed-Solomon code is specified as RS(1, k) with s-bit symbols, which means that the encoder takes k data symbols of s bits each, and adds (1-k) parity symbols to make an 1-symbol codeword. A Reed-Solomon decoder can correct up to t symbols that contain errors in a codeword, where 2t=1-k. For example, RS(255, 239) with 8-bit symbols means that each codeword contains 255 bytes, of which 239 bytes are data and 16 bytes are parity. The decoder can automatically correct errors contained in up to 8 bytes anywhere in the codeword.

Communication protocols vary between 1 Gbps and 10 Gbps EPON standards. According to the 10 Gbps EPON standard (10G-EPON), two connection configurations are supported, including "symmetric," which operates at a 10 Gbps data rate in both upstream (customer to provider) and downstream (provider to customer) directions, and "asymmetric," which operates at 10 Gbps in the downstream direction and 1 Gbps in the upstream direction. 10G-EPON supports line encoding. According to the 1 Gbps EPON standard (1G-EPON), 1 Gbps data rates are supported in the upstream and downstream directions. In a 1 Gbps EPON, an FEC-coded Ethernet frame may begin with a start FEC (SFEC) code sequence. Following SFEC is an Ethernet frame, which includes a preamble/start-of-frame delimiter (SFD) field, a data frame, and a frame-check-sequence (FCS) field. FCS field typically contains a cyclic redundancy check (CRC) sequence. Following FCS field is an end-of-frame delimiter terminate FEC (TFEC) indicating the end of the Ethernet frame. TFEC may delineate the Ethernet frame from subsequent FEC parity bits.

A serializer/de-serializer (SerDes) is an integrated circuit (IC or chip) transceiver that converts parallel data to serial data and vice-versa. A SerDes may be incorporated into each OLT and ONU in a PON. A transmitter section of a SerDes has parallel data input and serial data output. For example, a transmitter section of a SerDes in a gigabit Ethernet system may include 10 parallel input data lines clocked at 125 MHz and serial data output lines clocked at 1.25 GHz. A receiver section of the SerDes is the reverse of the transmitter section, i.e., serial data input and parallel data output. The receiver section recovers a clock embedded in a received signal for use in the decoding process. A gigabit Ethernet SerDes may use an 8B/10B coding scheme that maps 8-bit symbols to 10-bit symbols to achieve DC-balance on a transmission line.

A SerDes may require calibration for communication channel attributes, such as offsets, etc. Traditional calibration uses comparators and accumulators to adjust SerDes settings. A comparator receives the same input as a SerDes component to compare to a threshold while an accumulator counts the number of comparator events greater or less than the threshold for use in adjusting the component. Traditional calibration is done without regard to the accuracy of received bits relative to transmitted bits. The characteristics of transmitted data bits and patterns, e.g., frequency, edge, and errors in received characteristics, are not factored into calibration. Thus, traditional calibration is coarse, incapable of making fine adjustments. As a result, bit error rate (BER) may remain unacceptably high. A substantial quantity of input comparators may also increase the capacitive load of the input circuit.

BRIEF SUMMARY

Methods, systems, and apparatuses are described for a Serializer-Deserializer (SerDes) tuner that optimizes SerDes operation for a communication channel based on Forward Error Correction (FEC) feedback used to selectively tune or adjust SerDes operating parameters, such as vertical and horizontal sampling or slicing offsets, gain and equalization, to decrease the bit error rate (BER). Statistics report which bits and patterns are corrected and to what values. Knowledge of what was supposed to be received versus what was received is leveraged to correlate detected errors with underlying problems and solutions to optimize SerDes operation. Each node in a network, e.g., Ethernet Passive Optical Network (EPON), is enabled to fine tune its operation independently for each logical or physical channel to reduce BER. Methods, systems, and apparatuses are described for such SerDes tuners configured with FEC feedback, substantially as shown in and/or described herein in connection with at least one of the figures, as set forth more completely in the claims

BRIEF DESCRIPTION OF THE DRAWINGS/FIGURES

The foregoing summary, as well as the following detailed description, is better understood when read in conjunction with the accompanying drawings. The accompanying drawings, which are incorporated herein and form part of the specification, illustrate a plurality of embodiments and, together with the description, further serve to explain the principles involved and to enable a person skilled in the relevant art(s) to make and use the disclosed technologies. However, embodiments are not limited to the specific implementations disclosed herein. Unless expressly indicated by common numbering, each figure represents a partially or entirely different embodiment where components and steps in each embodiment are intentionally numbered differently compared to potentially similar components in other embodiments. The left-most digit(s) of a reference number identifies the number of the figure in which the reference number first appears.

Figure 1:
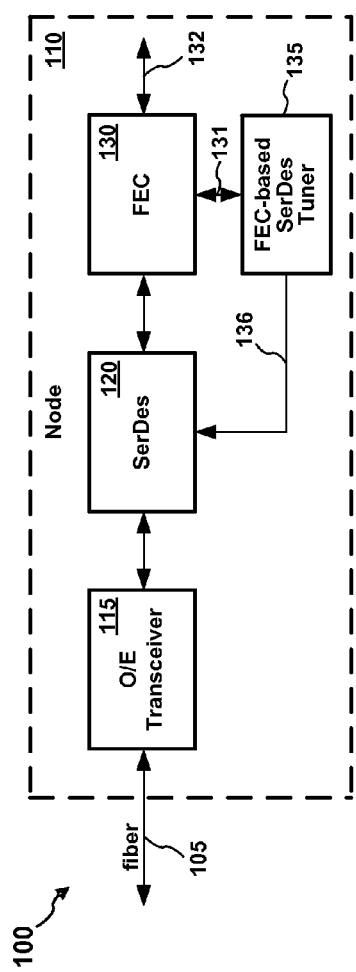
FIG. 1 shows a block diagram of an exemplary embodiment of a PON node using error statistics to tune a SerDes.

Exemplary embodiments will now be described with reference to the accompanying figures.

DETAILED DESCRIPTION

I. Introduction

Reference will now be made to embodiments that incorporate features of the described and claimed subject matter, examples of which are illustrated in the accompanying drawings. While the technology will be described in conjunction with various embodiments, it will be understood that the embodiments are not intended to limit the present technology. The scope of the subject matter is not limited to the disclosed embodiment(s). On the contrary, the present technology is intended to cover alternatives, modifications, and equivalents, which may be included within the spirit and scope the various embodiments as defined herein, including by the appended claims. In addition, in the following detailed description, numerous specific details are set forth in order to provide a thorough understanding of the present technology. However, the present technology may be practiced without these specific details. In other instances, well known methods, procedures, components, and circuits have not been described in detail as not to unnecessarily obscure aspects of the embodiments presented.

References in the specification to "embodiment," "example" or the like indicate that the subject matter described may include a particular feature, structure, characteristic, or step. However, other embodiments do not necessarily include the particular feature, structure, characteristic or step. Moreover, "embodiment," "example" or the like do not necessarily refer to the same embodiment. Further, when a particular feature, structure, characteristic or step is described in connection with an embodiment, it is submitted that it is within the knowledge of one skilled in the art to effect such feature, structure, or characteristic in connection with other embodiments whether or not those other embodiments are explicitly described.

Certain terms are used throughout the following description and claims to refer to particular system components and configurations. As one skilled in the art will appreciate, various skilled artisans and companies may refer to a component by different names. The discussion of embodiments is not intended to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct electrical connection. Thus, if a first device couples to a second device, that connection may be through a direct electrical connection or through an indirect electrical connection via other devices and connections.

II. Exemplary Use of FEC statistics to tune SerDes Operating Parameters

Methods, systems, and apparatuses will now be described for a Serializer-Deserializer (SerDes) tuner that optimizes SerDes operation for a communication channel based on Forward Error Correction (FEC) feedback used to selectively tune or adjust SerDes operating parameters, such as vertical and horizontal sampling or slicing offsets, gain and equalization, to decrease the bit error rate (BER). Statistics report which bits and patterns are corrected and to what values. Knowledge of what was supposed to be received versus what was received is leveraged to correlate detected errors with underlying problems and solutions to optimize SerDes operation. Each node in a network, e.g., an Ethernet Passive Optical Network (EPON), is enabled to fine tune its operation independently for each logical or physical channel.

In one embodiment, a device (e.g. SerDes, FEC, PON node, SerDes tuner, receiver, transmitter, transceiver, communication device, network device, ONU, OLT) comprises a SerDes tuner configured to tune (i.e. calibrate, adjust, correct) operation of a SerDes by using at least one error statistic, which encompasses error correction statistics, generated from at least one error detected in a signal to determine at least one operating parameter of the SerDes.

Functionality may be implemented in one or more components, e.g., in one or more of an error detection and correction circuit (e.g. FEC), SerDes, SerDes tuner and other components. Generally, an error-based SerDes tuner may comprise a statistics generator configured to generate the at least one error statistic from the at least one error detected in a signal; and a tuning logic configured to correlate the setting of the at least one SerDes parameter with the at least one error statistic, such as by generating one or more tuning signals to tune the setting(s) of the at least one operating parameter of the SerDes.

Correlation or mapping of one or more error statistics to one or more parameters or components is an implementation of identifying solutions to detected problems. Correlation may be predetermined and/or may be a learning function. Providing error statistics to logic that uses them to tune (e.g. identify an adjustment or setting for) a component or parameter is an example of correlation. Logic may comprise analog hardware, digital hardware, firmware, software or a combination thereof.

For example, signal errors may be detected by a FEC. Error statistics or error correction statistics may be generated by a FEC or other component with access to detected errors. A FEC or other error detector/corrector may provide error feedback or error statistic feedback to a SerDes tuner. For example, error statistics such as a quantity or count of particular bit errors or particular corrections may be provided as feedback.

Feedback may be provided to tune one or more operating parameters or components of a SerDes. For example, an amplifier feedback may provide a signal to tune operation of the amplifier, e.g., tune an automatic gain control (AGC) parameter, based on the at least one error statistic. An equalizer feedback may provide a signal to tune operation of the equalizer, e.g., a frequency response parameter, based on the at least one error statistic. A sampler feedback may provide a signal to tune operation of the sampler, e.g., a vertical sampling offset to define samples as zero or one bits, based on the at least one error statistic. A clock data recovery (CDR) feedback may provide a signal to tune operation of a CDR component, e.g., a horizontal sampling offset, based on the at least one error statistic.

In another embodiment, a communication channel comprises an amplifier having a gain parameter that amplifies a received signal into an amplified signal. An equalizer having an equalization parameter may modify at least one frequency component of the amplified signal into a frequency-modified signal. A sampler having a sampling offset parameter samples the frequency-modified signal to generate a first digital signal. A serial-to-parallel converter converts the first digital signal to a second digital signal. A FEC (forward error correction) unit detects errors in the second digital signal. The FEC performs error correction on the second digital signal based on the detected errors. The FEC may comprise an error statistics generator or a feedback may comprise a statistics generator that generates error statistics based on the detected errors and correction logic that generates a feedback signal configured to adjust one or more of the gain, equalization and sampling offset parameters based on the error statistics.

The statistics generator may comprise one or more counters that count the detected errors. Examples of tracking, e.g., by counting, different types of errors to generate statistics include maintaining a quantity or count of error corrected one bits, error corrected zero bits, early samples, late samples. Correction or tuning logic, e.g., a loop filter, may be configured to receive, for example, the quantity of error corrected one bits and the quantity of error corrected zero bits and to generate a feedback signal to adjust one or more parameters or components (e.g. gain parameter, sampling offset parameter, equalization parameter) when one or more error statistics reach one or more predetermined thresholds or when the quantity of one statistic exceeds a quantity of another statistic, etc.

In another embodiment, a method comprises receiving a signal; processing the signal in a Serializer-Deserializer (SerDes); detecting at least one error in the signal; generating at least one error statistic from the at least one error detection; and tuning at least one operating parameter of the SerDes using the at least one error statistic.

The method may further comprise correlating the at least one error statistic with the at least one operating parameter or component of the SerDes. Tuning may comprise selecting a setting of the correlated operating parameter or component; and tuning the at least one operating parameter or component of the SerDes using the selected setting. The method may further comprise providing one or more error statistics as feedback to a SerDes tuner, such as when an FEC generates error or error correction statistics. The method may further comprise providing a plurality of tuning feedbacks to the SerDes.

In some embodiments, generating the at least one error statistic comprises: generating a first error statistic for a first type of detected error; and generating a second error statistic for a second type of detected error. Tuning multiple parameters or components may comprise tuning a first operating parameter or component with a first adjustment when the first error statistic reaches a first threshold and tuning the first operating parameter or component with a second adjustment when the second error statistic reaches a second threshold. A second operating parameter or component may be tuned with a third adjustment when the first error statistic reaches a third threshold and the second error statistic reaches a fourth threshold. This may occur, for example, when the problem is the signal to noise ratio is low, causing numerous bit errors, and the solution is to adjust the amplifier component, and specifically to increase the signal gain parameter in the amplifier.

In some embodiments, a method comprises receiving a plurality of signals, respectively, from a plurality of logical or physical communication channels; and for each of the plurality of signals, separately: detecting at least one error in the signal; generating at least one error statistic from the at least one error detection; and tuning at least one operating parameter of the SerDes using the at least one error statistic. This may occur in multi-channel communications. For example, an OLT receives communications from many ONUs over a shared fiber. Each channel may be calibrated independently of other channels. In this way, an OLT may be optimized for communications from each particular ONU. An OLT may, for example, maintain error statistics in a separate table for each separate ONU.

In some embodiments, error statistics, or even adjustments based on error statistics, may be communicated between nodes. For example, in some embodiments, a method may comprise generating an error statistic in a first node and providing it to a second node; the second node tuning, e.g., making an adjustment to, an operating parameter or component of the second node in response to the error statistic from the first node. In some embodiments, an ONU receiver may detect an error attributable to an OLT transmitter. Either an error statistic or an adjustment based on the error statistic may be fed back from the ONU receiver to the OLT transmitter to rectify the problem.

An advantage of the error-based or FEC-based SerDes tuner operation is that it can make intelligent, informed calibration by comparing expected and actual results to correlate problems with solutions and selectively tune a SerDes for optimal operation for each logical or physical channel. A further advantage is that, since communications may comprise expected patterns prior to data, communication channels may be optimized using non-data information such as SFEC and SFD before data is communicated in the channel or received and processed. A further advantage is that tuning and calibration may occur without the traditional quantity of input comparators, and may decrease the capacitive load of the input circuit.

Embodiments may be implemented in various configurations. For instance, FIG. 1 shows a block diagram of an exemplary embodiment of a PON 100 using error statistics to tune a SerDes. PON 100 comprises fiber 105 and a node 110. Fiber 105 provides a communication medium between nodes in this embodiment (e.g., an optical fiber). While FIG. 1 provides an example of a PON, the technical subject matter described herein may be applied to any network. Further, while FIG. 1 provides an example of a PON node, such as an ONU or OLT, the technical subject matter described herein may be applied to any communication channel having parameters or components that can be tuned or calibrated based on error statistics.

Node 110 comprises fiber 105, O/E (optical-to-electrical) transceiver 115, SerDes 120, FEC 130 and FEC-based SerDes tuner 135. O/E transceiver 115 couples to and receives and transmits signals through fiber 105. O/E transceiver 115 provides a front-end for node 110. O/E transceiver 115 provides optical to electrical signal conversion and vice versa.

SerDes 120 receives the electrical signal output of O/E transceiver 115. SerDes 120 may be any SerDes capable of being tuned or calibrated based on error statistics. SerDes 120 processes the electrical signal output by O/E transceiver 115. For instance, SerDes 120 may receive a serial electrical signal (e.g., output by O/E transceiver 115), and may convert the received serial electrical signal to a parallel electrical signal. Alternatively, SerDes 120 may receive a parallel electrical signal (e.g., output by O/E transceiver 115), and may convert the parallel electrical signal to a serial electrical signal.

FEC 130 may comprise a receiver section and a transmitter section. A receiver section of FEC 130 receives the processed electrical signal output of SerDes 120 (e.g., a parallel bit stream). Of course, a transmitter section of FEC 130 may receive a parallel bit stream and embed error correction information prior to serializing the parallel bit stream. In the receiver section, FEC 130, using error correction information embedded in the received signal by a transmitting node, detects and corrects errors in the signal output of SerDes 120.

FEC 130 outputs a corrected signal 132, which may be subject to further processing within node 110. FEC 130 also outputs error data 131. Since functionality of the technical subject matter described herein may be implemented in a variety of different components, error data 131 may comprise detected errors, error statistics and/or error correction statistics. Error data 131 in particular embodiments may depend on whether FEC 130 is an error statistics generator or whether error statistics generation is performed by another component, such as FEC-based SerDes tuner 135.

FEC-based SerDes tuner 135 is in a feedback loop between FEC 130 and SerDes 120. The feedback loop generally correlates error statistics with adjustments or settings of SerDes parameters or components. For instance, for 1 Gbps EPON, FEC 130 may operate using 8b/10b encoding. 8b/10b encoding is a line code that maps 8-bit symbols to 10-bit symbols to achieve DC-balance and bounded disparity, while providing enough state changes to allow reasonable clock recovery (e.g., the difference between the count of 1s and 0s in a string of at least 20 bits is no more than 2, and there are not more than five 1s or 0s in a row). As such, 8 bits of data are transmitted as a 10-bit entity called a symbol, or character. The low 5 bit of data are encoded into a 6-bit group (the 5b/6b portion) and the top 3 bits are encoded into a 4-bit group (the 3b/4b portion). These code groups are concatenated together to form the 10-bit symbol that is transmitted on the wire. FEC 130 may convert a 10 bit encoded symbol received on fiber 105 back to the 8 bit symbol of original data. In an embodiment, in order to correlate an error within a FEC 8 bit symbol (that was received over fiber 105 as a 10 bit encoded symbol, and converted to an 8 bit symbol), the symbol is converted back to a 10 bit encoded symbol (e.g., by FEC 130 or by FEC-based Serdes Tuner 135). Of course specific implementations that correlate error statistics with adjustments or settings may vary between embodiments, including embodiments using different communication protocols (e.g. 1 Gbps and 10 Gbps EPON). In other words, FEC-based SerDes tuner correlates detected problems with solutions. FEC-based SerDes tuner 135 may generate statistics, provide tuning logic and/or implement tuning. FEC-based SerDes tuner 135 communicates with FEC 130, including receiving error data 131. FEC-based SerDes tuner 135 communicates with SerDes 120, including providing tuning data 136. Since functionality of the technical subject matter described herein may be implemented in a variety of different components, tuning data 136 may comprise error statistics, tuning signals, etc. For example, in embodiments where tuning logic is implemented in FEC-based SerDes tuner 135, tuning data 136 may comprise tuning signals. In embodiments where tuning logic is implemented in SerDes 120, tuning data 136 may comprise error statistics. In other embodiments, functionality in FEC-based SerDes tuner 135 may also be implemented in FEC 130 and/or SerDes 120.

Since communications may comprise expected patterns prior to data, for each communication channel that node 110 operates on, node 110 may detect errors and optimize the communication channel(s) using non-data information, such as SFEC and SFD, before data is communicated in the channel(s) or received and processed by node 110.

Errors may be tabulated continuously by some nodes while other nodes may periodically tabulate errors. Periodic tabulation may occur, for example, in nodes that operate on multiple logical or physical channels. Error statistics may be compiled separately for each node during periodic communications over a shared channel. Accordingly, error correction and tuning occur separately for each channel.

Errors may comprise bit errors and bit pattern errors. Error statistics may be raw or interpreted. For example, various bit patterns may be used to generate error statistics. The number of high frequency errors, e.g., 1010, and the number of low frequency errors, e.g., 0000 or 1111, may be tabulated separately and used to adjust equalizer settings for certain frequency components. Rising edge errors and falling edge errors may also be tabulated separately and used to adjust a horizontal sampling offset parameter.

Figure 2:
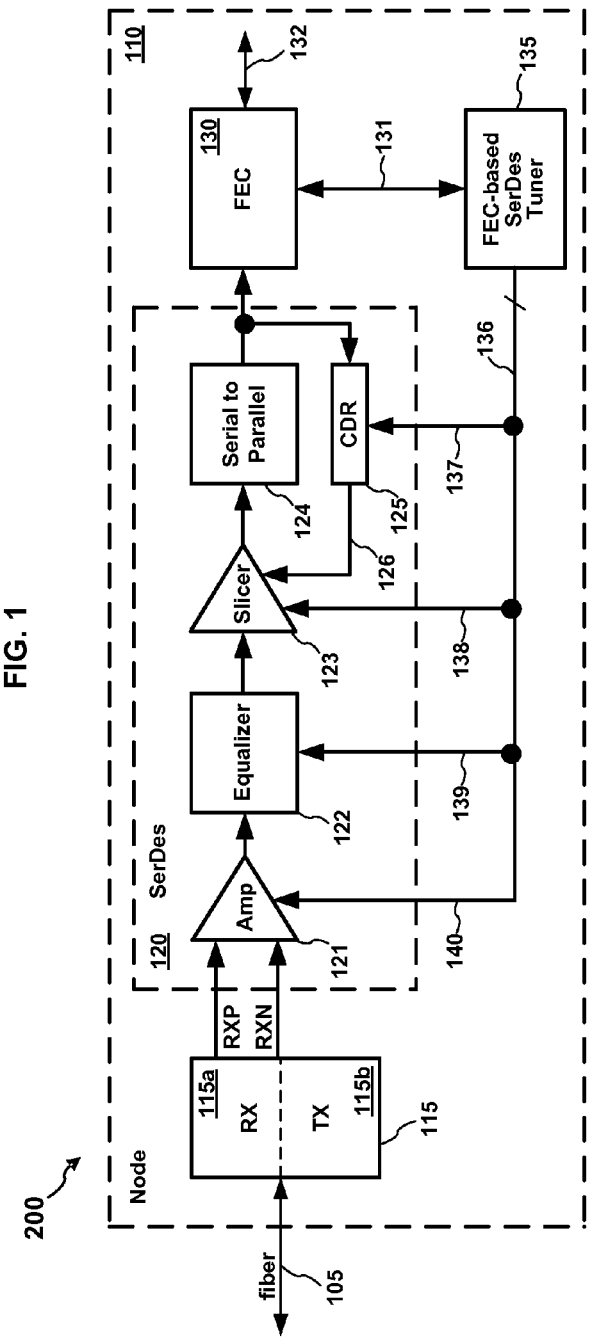
FIG. 2 shows an expanded block diagram of an exemplary embodiment of a PON node using error statistics to tune a SerDes.

FIG. 2 shows an expanded block diagram of an exemplary embodiment of a PON 200 using error statistics to tune a SerDes. PON 200 comprises fiber 105 and node 110. Node 110 comprises O/E transceiver 115, SerDes 120, FEC 130 and FEC-based SerDes tuner 135. O/E transceiver 115 is illustrated with a receiver (RX) 115a and a transmitter (TX) 115b. From an optical signal received via fiber 105, RX 115a generates a differential electrical signal on positive terminal RXP and negative terminal RXN.

SerDes 120 comprises signal processing components amplifier 121, equalizer 122, slicer (sampler) 123, serial to parallel converter 124 and CDR 125. Of course, other embodiments may implement a different communication channel having different components and/or components in different architectures. Different embodiments may have different tunable components and parameters. For example, some embodiments may comprise a tunable optical dispersion control component.

In the embodiment shown in FIG. 2, amplifier 121 receives the differential electrical signal on positive terminal RXP and negative terminal RXN. Amplifier 121 amplifies the received signal and generates a single-ended amplified signal, which is provided to equalizer 122. Amplifier 121 may have one or more tunable parameters. Automatic gain control (AGC) may be one tunable parameter of amplifier 121. Feedback provided by FEC-based SerDes tuner 135 may generate an amplifier feedback signal to provide amplifier tuning data 140. Amplifier tuning data 140 may tune or adjust amplifier 121 to optimize its operation for the communication channel in accordance with error statistics about errors detected and/or corrected by FEC 130.

Equalizer 122 receives the amplified signal from amplifier 121. In order to reduce distortion incurred in transmission through the communication channel, equalizer 122 may adjust one or more frequency components in the amplified signal. Thus, equalizer 122 may modify a frequency component of the amplified signal to generate a frequency-modified signal, which is provided to slicer (sampler) 123. Equalizer 122 may have one or more tunable parameters. An equalization parameter may be one tunable parameter of equalizer 122 (e.g., filtering or attenuating one or more frequencies received in the amplified signal). Feedback provided by FEC-based SerDes tuner 135 may generate equalizer feedback to provide equalizer tuning data 139. Equalizer tuning data 139 may tune or adjust equalizer 122 to optimize its operation for the communication channel in accordance with error statistics about errors detected and/or corrected by FEC 130.

Slicer (sampler) 123 receives the frequency-modified signal from equalizer 122. Slicer 123 samples the frequency-modified signal to generate a digital signal, e.g., a data stream of 1's and 0's. Thus, slicer 123 may be considered to be an example of an analog-to-digital converter (A/D). The digital signal is provided to serial to parallel converter 124. Slicer 123 may have one or more tunable parameters. A vertical sampling offset parameter may be one tunable parameter of slicer 123. The vertical sampling offset parameter defines a magnitude or boundary in the frequency-modified signal used to decide bit values, e.g., whether the sample is a 1 or a 0. A sampling clock 126 may be provided to slicer 123 by clock data recovery (CDR) 125. Sampling clock 126 defines a sampling interval to sample the frequency-modified signal. Feedback provided by FEC-based SerDes tuner 135 may generate slicer (sampler) feedback to provide slicer (sampler) tuning data 138. Slicer (sampler) tuning data 138 may tune or adjust slicer 123 to optimize its operation for the communication channel in accordance with error statistics about errors detected and/or corrected by FEC 130.

Serial to parallel converter 124 receives the digital signal from slicer 123. As its name suggests, serial to parallel converter 124 converts a serial data stream into a parallel data stream, which is referred to as a second digital signal. Serial to parallel converter 124 may have one or more tunable parameters, although none are indicated in this embodiment. In other embodiments, feedback provided by FEC-based SerDes tuner 135 may generate serial to parallel converter feedback (not shown in FIG. 2) to provide serial to parallel converter tuning data, which would tune or adjust serial to parallel converter 124 to optimize its operation for the communication channel in accordance with error statistics about errors detected and/or corrected by FEC 130.

FEC 130 and CDR 125 each receive the second digital signal (parallel data stream) from serial to parallel converter 124. FEC 130 uses error correction information embedded in the second digital signal to generate corrected signal 132, which may be subject to further processing within node 110. FEC 130 also outputs error data 131. Error data 131 may comprise detected errors, error statistics and/or error correction statistics. Error data 131 in particular embodiments may depend on whether FEC 130 is an error statistics generator or whether error statistics generation is performed by another component, e.g., FEC-based SerDes tuner 135.

CDR 125 supports proper operation of slicer 123. CDR 125 recovers a clock from the second digital signal. CDR 125 generates sampling clock 126 and provides it to slicer 123. Slicer 123 uses sampling clock 126 to sample the frequency-modified signal to generate the first digital signal, e.g., a serial data stream of 1's and 0's, provided to serial to parallel converter 124. CDR 125 may have one or more tunable parameters. A horizontal sampling offset parameter may be a tunable parameter of CDR 125. The horizontal sampling offset parameter defines a timing offset, delay or shift in the sampling clock to adjust the time at which samples are taken from the frequency-modified signal. Feedback provided by FEC-based SerDes tuner 135 may generate CDR feedback to provide CDR tuning data 137. CDR tuning data 137 may tune or adjust CDR 125 to optimize its operation for the communication channel in accordance with error statistics about errors detected and/or corrected by FEC 130.

FEC-based SerDes tuner 135 is in a feedback loop between FEC 130 and SerDes 120. The feedback loop correlates error statistics with adjustments or settings of SerDes parameters or components. FEC-based SerDes tuner 135 may generate statistics, provide tuning logic and/or implement tuning. In the embodiments illustrated in FIG. 2, tuning circuitry resides in SerDes components, e.g. amplifier 121, equalizer 122, slicer 123, CDR 137. FEC-based SerDes tuner 135 communicates with FEC 130, including to receive error data 131. FEC-based SerDes tuner 135 communicates with SerDes 120, including to provide tuning data 136. Tuning data 136 may comprise error statistics, tuning signals, etc. FEC-based SerDes tuner 135 feeds a tuning signal to each component, e.g., amplifier tuning data 140, equalizer tuning data 139, slicer tuning data 138 and CDR tuning data 137, when each component is present. In alternative embodiments, fewer, additional, and/or alternative components may be present in SerDes 120 than shown in FIG. 2. Tuning data may take many forms depending on tuning circuitry. In some embodiments, tuning data may comprise error or error correction statistics.

Figure 3:
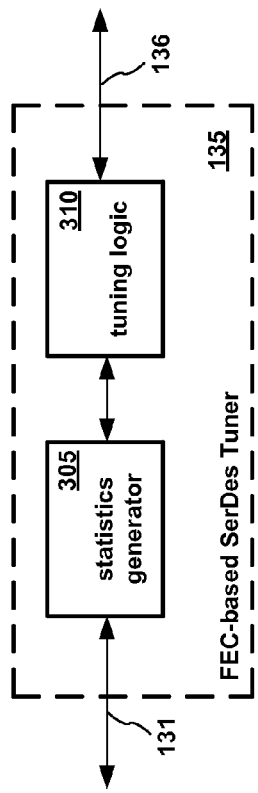
FIG. 3 shows a block diagram of an exemplary embodiment of an FEC-based SerDes tuner.

FIG. 3 shows a block diagram of an exemplary embodiment of an FEC-based SerDes tuner. FEC-based SerDes tuner 135 comprises statistics generator 305 and tuning logic 310. Statistics generator 305 receives error data 131 comprising one or more errors detected in the signal being processed (e.g., the parallel data stream generated by serial to parallel converter 124), or corrections made to those detected errors. Statistics generator 305 uses error data 131 to generate one or more error statistics. Statistics generator provides the one or more statistics to tuning logic 310.

Examples of statistics that may be generated by statistics generator 305 include raw errors and interpreted errors. For example, raw errors may include a quantity or count of error corrected one bits and error corrected zero bits. Error interpretation to compile or generate error statistics may require interpretation of raw errors in the context in which they occur, such as a particular pattern or order. Interpreting errors for particular statistics may, in and of itself, provide a degree of correlation of errors to particular components and parameters. Some embodiments may collect a specific set of error statistics for each tunable parameter or component. Examples of interpreted errors may comprise, for example, early sampling errors and late sampling errors. The statistics generator may comprise one or more counters that count the detected errors. A time limit or count threshold may be applied to statistics generation to take action (e.g., adjust a parameter or component or generate a flag) and/or restart statistics generation. Statistics generator may generate error statistics for one or more logical or physical channels. For example, each channel may have its own error statistics table in memory.

Tuning logic 310 receives error statistics from statistics generator 305. Tuning logic generates one or more tuning signals and provides them as tuning data 316 to one or more components of SerDes 120. Tuning logic 310 correlates the setting or adjustment of one or more tunable parameters or components with one or more error statistics. Correlation may be predetermined and/or may be a learning function. Correlation or mapping of one or more error statistics to one or more parameters or components is an implementation of identifying solutions to detected problems. Providing or routing particular error statistics to logic that uses them to tune (e.g. identify an adjustment or setting for) a component or parameter is an example of correlation. Tuning logic not only correlates error statistics with particular components or parameters, but also with particular adjustments or settings of those components or parameters. The result is one or more tuning signals provided to one or more tunable components or parameters, which is provided as tuning data 316. Tunable components may have circuitry with an interface that receives tuning data. Tuning logic may comprise analog hardware, digital hardware, firmware, executable software or a combination thereof.

An example of error detection, statistics generation and tuning logic is provided as follows. A detected error or raw error is a single bit error in a pattern of three consecutive bits. The error statistic is an interpreted error, which is interpreted from the raw error statistic. The error statistic is correlated with a horizontal sampling offset parameter of component CDR 125, which may be adjusted using CDR tuning data 137.

Assume a node transmitted a signal through fiber 105 having bit stream pattern 000111011 and assume node 110 received the signal and processed it into bit stream pattern 000011011 at the output of serial to parallel converter 124. Assume the bit positions are numbered one to nine from left to right. In this case, FEC 130 detects bit 4 as an error. Given that the other bits are accurate, bit 4 error may be interpreted to be due to a late edge, which is detected when a preceding bit value is carried into a next bit position because an edge for the preceding bit occurred too late relative to sampling. Depending on a threshold for this type of interpreted error, it may be necessitate a shift in the horizontal sampling offset to eliminate such error(s). A related interpreted error is an early edge, which is detected when a subsequent bit value is carried forward to a preceding bit position because an edge for the subsequent bit occurred too early relative to sampling.

An example of statistics generator 305, and specifically raw error interpretation logic that identifies the problems of late edges and early edges from raw error data to create late edge and early edge error statistics is as follows:

```
if (transmitted data == 011 and receive data == 001) or
   (transmitted data == 100 and received data == 110) /// late edge
   late ++;
else if (transmitted data == 001 and receive data == 011) or
   (transmitted data == 110 and received data == 100) // early edge
   early ++;
```

This logic may analyze a running three-bit pattern for early and late edges. This logic interprets raw error data as a late edge when a three bit pattern evidences a holdover bit value. A late edge statistic is created for each detection of a late edge (incrementing the value of "late" for each late edge detection). This logic interprets raw error data as an early edge when a three bit pattern evidences a carry forward bit value. An early edge statistic is created for each detection of an early edge (incrementing the value of "early" for each early edge detection).

An example of tuning logic 310 that generates tuning data 136, and specifically CDR tuning data 137 to tune, adjust, set or correct the horizontal sampling offset parameter of CDR 125 in accordance with the error statistic(s) is as follows:

```
wait(time);
if (late > early) shift sample right;
else if (early > late) shift sample left;
```

In this example, two error statistics are compared to each other rather than to a threshold. Periodically, after expiration of a time period time, the two error statistics early and late are compared to see if one is greater than another. If late edges exceed early edges then horizontal sampling offset may be shifted right to make the sampling edge occur later, i.e., shift sampling clock 126 edge right to delay it. If early edges exceed late edges then horizontal sampling offset may be shifted left to make the sampling edge occur earlier, i.e., shift sampling clock 126 edge left.

Figure 4:
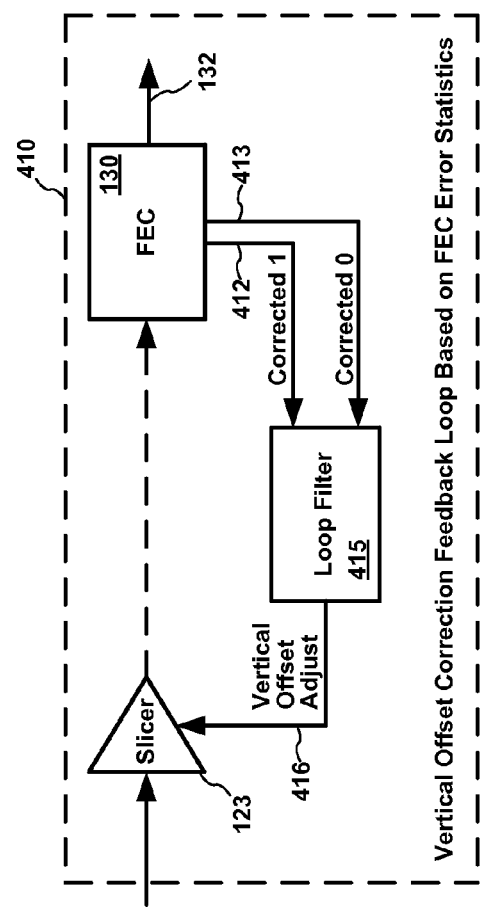
FIG. 4 shows a block diagram of an exemplary embodiment of a vertical offset correction feedback loop based on FEC error statistics.

FIG. 4 shows a block diagram of an exemplary embodiment of a vertical offset correction feedback loop based on FEC error statistics. Vertical offset correction feedback loop 400 comprises slicer 123, FEC 130 and loop filter 415. In this embodiment, statistics generator 305 in FIG. 3 is implemented in FEC 130 and tuning logic 310 is implemented in loop filter 415. In this embodiment, FEC 130 detects errors, corrects errors and generates statistics. FEC 130 generates a first statistic comprising a quantity or count of bits having their value corrected from zero to one, i.e., corrected 1 bits 412. FEC 130 generates a second statistic comprising a count of bits having their value corrected from one to zero, i.e., corrected 0 bits 413.

These two error correction statistics are provided to loop filter 415. Loop filter 415 applies error statistics (corrected 1 bits 412 and corrected 0 bits 413) to tuning logic to generate a feedback signal, i.e., vertical offset adjust tuning signal 416, which is provided to slicer 123. Exemplary tuning logic may comprise, for example, reducing the vertical sampling offset of slicer 416 if substantially more one bits, based on a first threshold, are incorrectly sampled as zero bits than vice versa. Likewise, exemplary logic may increase the vertical sampling offset of slicer 416 if substantially more zero bits, based on a second threshold, are incorrectly sampled as one bits than vice versa.

It is evident that a wide variety of logic may be applied to a wide variety of error statistics to obtain a wide variety of correlations between detected problems per error statistics and solutions per tuning signals. For example, in another embodiment, the same two error correction statistics 412, 413 may be compared to each other or to third and fourth thresholds to determine whether the signal to noise ratio is too low (e.g., where too many bit errors are occurring). Too much noise may lead to a wide variety of errors. A solution to such a detected problem may be to increase the gain of amplifier 121 to increase the signal to noise ratio.

Figure 5:
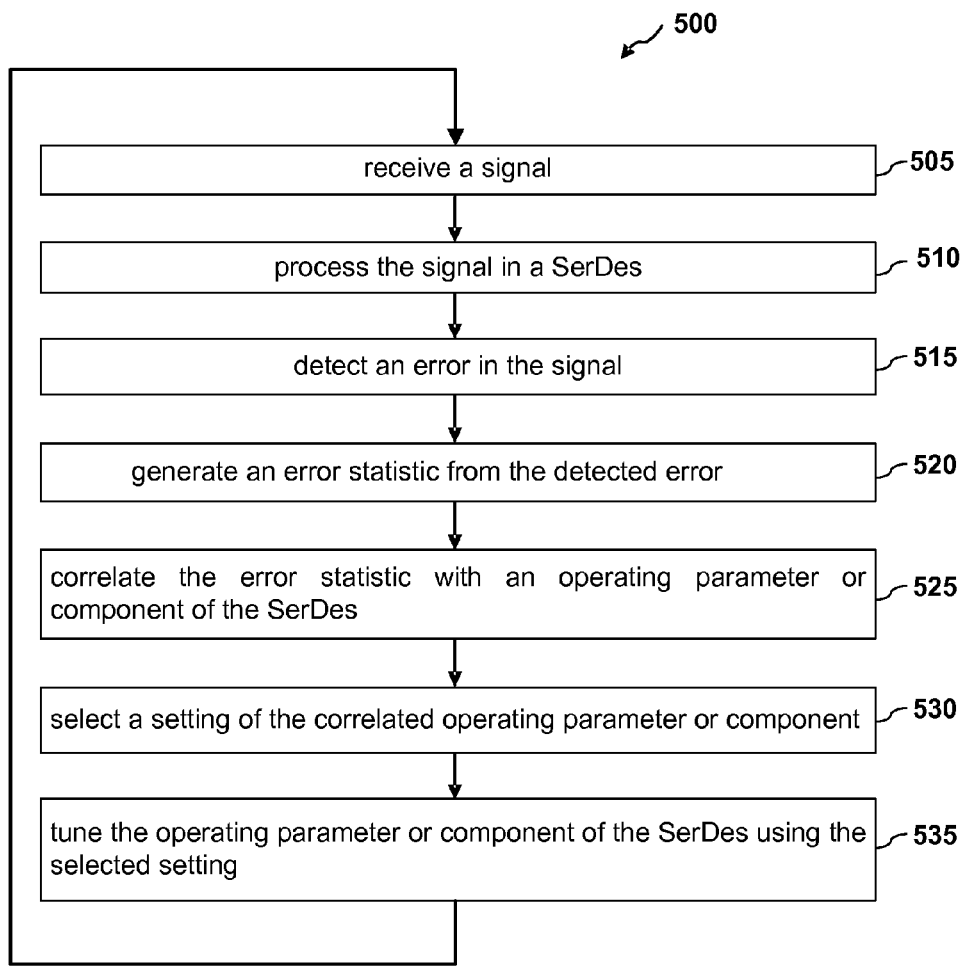
FIG. 5 shows an exemplary embodiment of a method of optimizing a SerDes using error statistics.

Embodiments may also be implemented in processes or methods. For example, FIG. 5 shows an exemplary embodiment of a method of optimizing a SerDes using error statistics. Node 110, FEC-based SerDes tuner 135, vertical offset correction feedback loop 410 and other embodiments in accordance with the technical subject matter described herein may operate according to method 500. Method 500 comprises steps 505 to 535 shown in a loop. However, other embodiments may operate according to other methods. Other structural and operational embodiments will be apparent to persons skilled in the relevant art(s) based on the foregoing discussion of embodiments. No order of steps is required unless expressly indicated or inherently required. There is no requirement that a method embodiment implement all of the steps illustrated in FIG. 5. FIG. 5 is simply one of many possible embodiments. Embodiments may implement fewer, more or different steps.

Method 500 begins with step 505. In step 505, a signal is received. For example, as shown in FIGS. 1 and 2, a signal may be received at node 110 through fiber 105. An O/E transceiver 115 may convert the optical signal into an electrical signal and provide it to SerDes 120 for processing.

At step 510, the received signal is processed in a SerDes. For example, as shown in FIG. 2, the differential signal received through positive and negative receiver terminals RXP, RXN is processed by SerDes components amplifier 121, equalizer 122, slicer 123 and serial to parallel converter 124.

At step 515, an error is detected in the signal. For example, as shown in FIGS. 1, 2 and 4, FEC 130 detects and corrects errors in the processed signal, e.g., parallel bit stream, generated by SerDes 120. In different embodiments, errors may be detected in a signal before, during or after processing by SerDes. SerDes or other components in a communication channel are configured with one or more tunable components or parameters to correct the error based on one or more error statistics.

At step 520, an error statistic is generated from the error detected in step 515. For example, as shown in FIGS. 1-4, FEC-based SerDes tuner 135 generates one or more error statistics from errors detected by FEC 130. In FIG. 4, FEC 130 implements a portion of FEC-based SerDes tuner 135 to generate two error statistics, i.e., corrected 1 bits 412 and corrected 0 bits 413. While the error statistics in FIG. 4 are statistics of raw errors, in other embodiments error statistics may be generated for interpreted error statistics, which may be specific to a particular component or parameter (e.g., bit error counts, early and/or late edge counts, etc.).

At step 525, error statistics generated in step 520 are correlated with an operating parameter or component of the SerDes. For example, as shown in FIG. 4, two error statistics, i.e., corrected 1 bits 412 and corrected 0 bits 413 are correlated with SerDes component slicer 123 and, specifically, a vertical sampling offset parameter of SerDes 110. Correlation is evident by providing error statistics corrected 1 bits 412 and corrected 0 bits 413 to tuning logic, i.e., loop filter 415, which generates vertical offset adjust tuning signal 416. In other embodiments, correlation may be implemented with a variety of techniques. For example, executable code may access an index table stored in memory that maps a component, parameter or a particular setting or adjustment thereof to error statistics. Any number of correlation algorithms implemented by a variety of techniques may be suitable in various embodiments.

At step 530, a setting or adjustment is selected for the component or operating parameter that was correlated with the one or more error statistics in step 525. For example, as shown in FIGS. 1-4, FEC-based SerDes tuner 135 generates tuning data 136 correlated with the one or more error statistics for each respective tunable component or parameter. More specifically, in FIG. 2, FEC-based SerDes tuner 135 determines, generates or selects settings or adjustments for amplifier tuning data 140, equalizer tuning data 139, slicer tuning data 138 and CDR tuning data 137 to respectively tune amplifier 121, equalizer 122, slicer 123 and CDR 125. Also, in the example shown in FIG. 4, loop filter 415 generates a setting or adjustment for vertical offset adjust tuning signal 416 to tune slicer 123, which is correlated with error statistics corrected 1 bits 412 and corrected 0 bits 413.

At step 535, the correlated component or operating parameter of the SerDes is tuned using the setting or adjustment selected in step 530. For example, as shown in FIGS. 1, 2 and 4, components or parameters in SerDes 110 are tuned with tuning data 136. More specifically, in FIG. 2, amplifier 121, equalizer 122, slicer 123 and CDR 125 are tuned, respectively, using amplifier tuning data 140, equalizer tuning data 139, slicer tuning data 138 and CDR tuning data 137. In FIG. 4, slicer 123 is tuned using vertical offset adjust tuning signal 416.

III. CONCLUSION

Methods, systems, and apparatuses are described for optimizing Serializer-Deserializer (SerDes) operation based on signal error statistics. Forward Error Correction (FEC) may provide feedback of error statistics or error correction statistics to a SerDes tuner, which uses the statistics to selectively tune or adjust SerDes operating parameters, such as vertical and horizontal sampling or slicing offsets, gain and equalization, to decrease the bit error rate (BER). Statistics report which bits and patterns are corrected and to what values. Knowledge of what was supposed to be received versus what was received is leveraged to correlate detected errors with underlying problems and solutions to optimize SerDes operation. Each node in a network, e.g., Ethernet Passive Optical Network (EPON), is enabled to fine tune its operation independently for each logical or physical channel. An advantage of the error-based or FEC-based SerDes tuner is that it can make intelligent, informed calibration by comparing expected and actual results to correlate problems with solutions and selectively tune a SerDes for optimal operation for each logical or physical channel. A further advantage is that, since communications may comprise expected patterns prior to data, communication channels may be optimized using non-data information such as such as SFEC and SFD before data is communicated in the channel or received and processed. A further advantage is that tuning and calibration may occur without the traditional quantity of input comparators, and may decrease the capacitive load of the input circuit.

Embodiments are not limited to the functional blocks, detailed examples, steps, order or the entirety of subject matter presented in the figures, which is why the figures are referred to as exemplary embodiments.

A device, as defined herein, is a machine or manufacture as defined by 35 U.S.C. §101. A device may comprise, for example but not limited to, SerDes, FEC, PON node, SerDes tuner, receiver, transmitter, transceiver, communication device, network device, ONU, OLT, etc. Devices may be digital, analog or a combination thereof. Devices may be implemented with any semiconductor technology, including one or more of a Bipolar Junction Transistor (BJT), a heterojunction bipolar transistor (HBT), a metal oxide field effect transistor (MOSFET) device, a metal semiconductor field effect transistor (MESFET) or other transconductor or transistor technology device. Such alternative devices may require alternative configurations other than the configuration illustrated in embodiments presented herein.

Techniques, including methods, described herein may be implemented in hardware (digital and/or analog) or a combination of hardware and software and/or firmware. Techniques described herein may be implemented in one or more components. Embodiments may comprise computer program products comprising logic (e.g., in the form of program code or software as well as firmware) stored on any computer useable medium, which may be integrated in or separate from other components. Such program code, when executed in one or more processors, causes a device to operate as described herein. Devices in which embodiments may be implemented may include storage, such as storage drives, memory devices, and further types of computer-readable media. Examples of such computer-readable media include, but are not limited to, a hard disk, a removable magnetic disk, a removable optical disk, flash memory cards, digital video disks, random access memories (RAMs), read only memories (ROM), and the like. In greater detail, examples of such computer-readable media include, but are not limited to, a hard disk associated with a hard disk drive, a removable magnetic disk, a removable optical disk (e.g., CDROMs, DVDs, etc.), zip disks, tapes, magnetic storage devices, MEMS (micro-electromechanical systems) storage, nanotechnology-based storage devices, as well as other media such as flash memory cards, digital video discs, RAM devices, ROM devices, and the like. Such computer-readable media may, for example, store computer program logic, e.g., program modules, comprising computer executable instructions that, when executed, provide and/or maintain one or more aspects of functionality described herein with reference to the figures, as well as any and all components, steps and functions therein and/or further embodiments described herein.

Proper interpretation of subject matter described herein and claimed hereunder is limited to patentable subject matter under 35 U.S.C. §101. Subject matter described in and claimed based on this patent application is not intended to and does not encompass unpatentable subject matter. As described herein and claimed hereunder, a method is a process defined by 35 U.S.C. §101. As described herein and claimed hereunder, each of a circuit, device, apparatus, machine, system, computer, module, media and the like is a machine and/or manufacture defined by 35 U.S.C. §101.

While a limited number of embodiments have been described, those skilled in the art will appreciate numerous modifications and variations there from. Embodiments have been presented by way of example only, and not limitation. It will be apparent to persons skilled in the relevant art(s) that various changes in form and details can be made therein without departing from the spirit and scope of the disclosed technologies. The exemplary appended claims encompass embodiments and features described herein, modifications and variations thereto as well as additional embodiments and features that fall within the true spirit and scope of the disclosed technologies. Thus, the breadth and scope of the disclosed technologies should not be limited by any of the above-described exemplary embodiments, but should be defined only in accordance with the following claims and their equivalents.

What is claimed is:

1. A device comprising:
a Serializer-Deserializer (SerDes) tuner configured to tune operation of a SerDes based on a plurality of different error statistics generated from a plurality of different types and/or patterns of errors tracked in the operation of the SerDes.

2. The device of claim 1, wherein the at least one of the plurality of different error statistics is generated from at least one error detected by a Forward Error Correction (FEC) component.

3. The device of claim 2, wherein the at least one of the plurality of different error statistics comprises at least one error correction statistic.

4. The device of claim 2, further comprising:
an FEC component;
a SerDes component; and
a feedback comprising the SerDes tuner.

5. The device of claim 4, wherein the feedback comprises at least one of:
an amplifier feedback configured to tune operation of an amplifier component of the SerDes based on the at least one of the plurality of different error statistics;
an equalizer feedback configured to tune operation of an equalizer component of the SerDes based on the at least one of the plurality of different error statistics;
a sampler feedback configured to tune operation of a sampler component of the SerDes based on the at least one of the plurality of different error statistics; and
a CDR feedback configured to tune operation of a clock data recovery (CDR) component of the SerDes based on the at least one of the plurality of different error statistics.

6. The device of claim 1, the SerDes tuner comprising:
a statistics generator configured to generate the at least one of the plurality of different error statistics; and
a tuning logic configured to correlate a setting of at least one operating parameter of the SerDes with the at least one of the plurality of different error statistics.

7. The device of claim 6, wherein an 8 bit symbol converted from a received 10 bit encoded symbol is converted back to the 10 bit encoded symbol prior to the tuning logic correlating the setting of the at least one operating parameter with the at least one of the plurality of different error statistics, the at least one of the plurality of different error statistics including an error detected in the 10 bit encoded symbol.

8. The device of claim 6, wherein the at least one of the plurality of different error statistics generated by the statistics generator comprises a quantity of error corrected one bits and a quantity of error corrected zero bits; and
wherein the tuning logic is configured to receive the quantity of error corrected one bits and the quantity of error corrected zero bits and to generate a tuning signal to adjust the at least one operating parameter when one of the quantity of the error corrected one bits reaches a first threshold or the quantity of error corrected zero bits reaches a second threshold.

9. A method comprising:
processing a Serializer-Deserializer (SerDes) communication;
tracking a plurality of different types and/or patterns of errors in the SerDes communication;

generating a plurality of different error statistics from the tracked plurality of different types and/or patterns of errors; and tuning at least one operating parameter or component of the SerDes using at least one of the plurality of different error statistics.

10. The method of claim 9, further comprising:
correlating the at least one of the plurality of different error statistics with the at least one operating parameter or component of the SerDes.

11. The method of claim 10, wherein the tuning of the at least one operating parameter of the SerDes using the at least one of the plurality of different error statistics comprises:
selecting a setting of the correlated operating parameter or component; and
tuning the at least one operating parameter or component of the SerDes using the selected setting.

12. The method of claim 9, further comprising:
providing the at least one of the plurality of different error statistics as feedback to a SerDes tuner.

13. The method of claim 9, further comprising:
providing a plurality of tuning feedbacks to the SerDes based on the at least one of the plurality of different error statistics.

14. The method of claim 9, wherein the generating of the at least one of the plurality of different error statistics comprises:
generating a first error statistic for a first type of detected error; and
generating a second error statistic for a second type of detected error.

15. The method of claim 14, wherein the tuning of the at least one operating parameter or component of the SerDes using the at least one of the plurality of different error statistics comprises:
tuning a first operating parameter or component with a first adjustment when the first error statistic reaches a first threshold;
tuning the first operating parameter or component with a second adjustment when the second error statistic reaches a second threshold; and
tuning a second operating parameter or component with a third adjustment when the first error statistic reaches a third threshold and the second error statistic reaches a fourth threshold.

16. The method of claim 9, further comprising:
receiving a plurality of signals, respectively, from a plurality of communication channels; and
for each signal of the plurality of signals, separately:
detecting at least one error in the signal;
generating at least one error statistic from the at least one error detection; and
tuning at least one operating parameter of the SerDes using the at least one error statistic.

17. A communication channel, comprising:
an amplifier having a gain parameter that amplifies a received signal into an amplified signal;
an equalizer having an equalization parameter that modifies at least one frequency component of the amplified signal into a frequency-modified signal;
a sampler having a sampling offset parameter that samples the frequency-modified signal to generate a first digital signal;
a serial-to-parallel converter that converts the first digital signal to a second digital signal;
a FEC (forward error correction) unit that detects a plurality of different types of errors in the second digital signal and performs error correction on the second digital signal based on the plurality of different types of detected errors; and
a feedback comprising:
a statistics generator that generates a plurality of different error statistics based on the plurality of different types of detected errors, and
correction logic that generates at least one feedback signal configured to adjust at least one of the gain, equalization and sampling offset parameters based on at least one of the plurality of different types of error statistics.

18. The communication channel of claim 17, wherein the statistics generator comprises a plurality of counters that count the plurality of different types of detected errors.

19. The communication channel of claim 18, wherein the correction logic generates the at least one feedback signal to adjust the at least one parameter when at least one of the counted plurality of different types of detected errors reaches a predetermined threshold.

20. The communication channel of claim 17, wherein the correction logic generates the least one feedback signal to adjust the gain parameter, sampling offset parameter and equalization parameter.

* * * * *